(12) United States Patent
Cheng et al.

(10) Patent No.: US 10,128,238 B2
(45) Date of Patent: Nov. 13, 2018

(54) INTEGRATED CIRCUIT HAVING OXIDIZED GATE CUT REGION AND METHOD TO FABRICATE SAME

(71) Applicant: International Business Machines Corporation, Armonk, NY (US)

(72) Inventors: Kangguo Cheng, Schenectady, NY (US); Andrew Mark Greene, Albany, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 15/232,269

(22) Filed: Aug. 9, 2016

(65) Prior Publication Data

US 2018/0047726 A1    Feb. 15, 2018

(51) Int. Cl.
| | |
|---|---|
| *H01L 21/00* | (2006.01) |
| *H01L 21/84* | (2006.01) |
| *H01L 27/088* | (2006.01) |
| *H01L 27/12* | (2006.01) |
| *H01L 29/49* | (2006.01) |

(Continued)

(52) U.S. Cl.
CPC .. *H01L 27/0886* (2013.01); *H01L 21/823418* (2013.01); *H01L 21/823431* (2013.01); *H01L 21/823437* (2013.01); *H01L 21/845* (2013.01); *H01L 27/1211* (2013.01);

(Continued)

(58) Field of Classification Search
CPC ........... H01L 21/336; H01L 21/823431; H01L 21/02661; H01L 21/762; H01L 21/76224; H01L 29/0653; H01L 29/16; H01L 29/49; H01L 21/823481; H01L 21/823418;

(Continued)

(56) References Cited

U.S. PATENT DOCUMENTS

| | | |
|---|---|---|
| 8,455,307 B2 | 6/2013 | Cho |
| 8,617,961 B1 | 12/2013 | Haran et al. |

(Continued)

OTHER PUBLICATIONS

Li, Jian, et al., "Effective wet clean method to eliminate unwanted growth SiGe defect in FinFET", ASMC 2015, 3 pgs.

*Primary Examiner* — Charles Garber
*Assistant Examiner* — Abdulfattah Mustapha
(74) *Attorney, Agent, or Firm* — Harrington & Smith (57) ABSTRACT

A method includes epitaxially depositing source/drains on parallel semiconductor fins having parallel polysilicon gate precursor structures disposed thereon orthogonally to the fins, where two adjacent polysilicon gate precursor structures are joined together and connected at ends thereof by a polysilicon loop portion. The method further includes oxidizing the ends of the polysilicon precursor gate structures, the connecting polysilicon loop portion and any semiconductor nodules that formed on the connecting polysilicon loop portion during the step of epitaxially depositing the source/drains. A structure includes a substrate; a plurality of parallel semiconductor fins disposed on the substrate; a plurality of parallel metal gate structures overlying the plurality of fins and orthogonal to the plurality of fins; and a plurality of source/drain structures disposed on the fins. In the structure two adjacent metal gate structures are joined together and connected at end portions thereof by a loop portion comprised of a semiconductor oxide.

19 Claims, 5 Drawing Sheets

(51) Int. Cl.
*H01L 21/8234* (2006.01)
*H01L 29/40* (2006.01)

(52) U.S. Cl.
CPC ........ *H01L 29/401* (2013.01); *H01L 29/4916* (2013.01); *H05K 999/99* (2013.01)

(58) Field of Classification Search
CPC ............. H01L 21/31053; H01L 21/308; H01L 21/3065; H01L 29/7848; H01L 21/02532
See application file for complete search history.

(56) References Cited

U.S. PATENT DOCUMENTS

| | | | |
|---|---|---|---|
| 8,673,372 B2 | 1/2014 | Liu et al. | |
| 8,703,557 B1 | 4/2014 | Cai et al. | |
| 8,912,612 B2 | 12/2014 | Basker et al. | |
| 8,967,515 B2 | 3/2015 | Pallmann | |
| 9,087,858 B2 | 7/2015 | Yoo et al. | |
| 9,318,579 B2 | 4/2016 | Liu et al. | |
| 2004/0155244 A1* | 8/2004 | Kawata | H01L 29/66772 257/59 |
| 2011/0198695 A1* | 8/2011 | Anderson | H01L 21/845 257/347 |
| 2013/0178020 A1* | 7/2013 | Cai | H01L 29/785 438/151 |
| 2014/0264596 A1 | 9/2014 | He et al. | |
| 2015/0255295 A1 | 9/2015 | Jacob et al. | |
| 2015/0303194 A1 | 10/2015 | Lee et al. | |
| 2015/0357441 A1* | 12/2015 | Liu | H01L 29/66795 257/401 |

\* cited by examiner

INTEGRATED CIRCUIT HAVING OXIDIZED GATE CUT REGION AND METHOD TO FABRICATE SAME

TECHNICAL FIELD

The various embodiments of this invention relate generally to semiconductor devices and fabrication techniques and, more specifically, relate to the fabrication of semiconductor transistor devices such as field effect transistors (FETs), in particular FinFETs.

BACKGROUND

A typical FinFET is three dimensional complementary metal oxide semiconductor (CMOS) structure disposed upon a planar substrate. A conducting FET channel between source and drain regions is surrounded on three or more sides by one or more gate electrodes giving the FinFET more volume than a planar gate FET in the same planar area. The surrounding gate electrode(s) control current flow through the conducting channel and, ideally, very little current is allowed to pass through the channel when the FinFET is in the off state. The FinFET has been used to fabricate CMOS transistors at least since the technology evolved to the 22 nm regime.

While the FinFET source/drain (S/D) regions can be doped by ion implanting a suitable dopant species, typically the FinFET employs an epitaxially grown S/D in order to reduce resistance. Such epitaxially grown S/Ds may be referred to as (in situ doped) raised S/Ds (RSDs).

A problem that can arise during the epitaxial growth of RSDs relates to a formation of undesirable semiconductor nodules that have a potential to create an electrical short circuit.

SUMMARY

In a first aspect thereof the embodiments of this invention provide a method that comprises epitaxially depositing source/drains on parallel semiconductor fins having parallel polysilicon gate precursor structures disposed thereon orthogonally to the fins, where two adjacent polysilicon gate precursor structures are joined together and connected at ends thereof by a polysilicon loop portion.

The method further comprises oxidizing the ends of the polysilicon precursor gate structures, the connecting polysilicon loop portion and any semiconductor nodules that formed on the connecting polysilicon loop portion during the step of epitaxially depositing the source/drains.

In another aspect thereof the embodiments of this invention provide a method that comprises providing a structure comprised of a substrate supporting a plurality of semiconductor fins disposed parallel to one another and a plurality of polysilicon gate precursor structures overlying the plurality of fins and disposed parallel to one another and orthogonal to the plurality of fins, where two adjacent gate precursor structures are joined together and connected at ends thereof by a polysilicon loop portion, The method further comprises depositing a gate spacer dielectric layer on sidewalls of at least the polysilicon gate precursor structures and polysilicon loop portion, and epitaxially depositing semiconductor sources and drains on exposed portions of the fins not underlying the polysilicon gate precursor structures. In the method the step of epitaxially depositing the semiconductor sources and drains results in semiconductor nodules being formed in a region of the polysilicon loop portion that is not completely covered by the gate spacer dielectric layer. The method further comprises applying a mask to cover the semiconductor sources and drains and the gate spacer dielectric layer disposed on the sidewalls of at least the polysilicon gate precursor structures, where the mask comprises an opening that exposes at least the ends of the polysilicon gate precursor structures, the connecting polysilicon loop portion, and any semiconductor nodules located in a region of the polysilicon loop portion that is not completely covered by the gate spacer dielectric layer. The method further comprises removing the gate spacer dielectric layer from exposed sidewalls of the ends of the polysilicon gate precursor structures and the exposed connecting polysilicon loop portion and oxidizing the exposed ends of the polysilicon gate precursor structures, the exposed connecting polysilicon loop portion and the exposed semiconductor nodules.

In another aspect thereof the embodiments of this invention provide a structure that comprises a substrate; a plurality of semiconductor fins disposed on a surface of the substrate in a parallel relationship to one another; a plurality of metal gate structures overlying the plurality of fins and disposed in a parallel relationship to one another and orthogonal to the plurality of fins; and a plurality of source/drain structures disposed on the fins. In the structure two adjacent metal gate structures are joined together and connected at end portions thereof by a loop portion, where the loop portion is comprised of a semiconductor oxide.

BRIEF DESCRIPTION OF THE SEVERAL VIEWS OF THE DRAWINGS

FIGS. 2-8 are each an enlarged elevational view showing various initial, intermediate and completed or substantially completed structures that are fabricated in accordance with embodiments of this invention, wherein the various structure widths and heights and layer thicknesses are not necessarily drawn to scale. More specifically:

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses and methods that are suitable for use in implementing the embodiments of this invention can include, but are not limited to, chemical vapor deposition (CVD) such as, for example, rapid thermal chemical vapor deposition (RTCVD), atmospheric pressure chemical vapor deposition (APCVD), low pressure chemical vapor deposition (LP-CVD) and ultra-high vacuum chemical vapor deposition (UHVCVD). Other suitable epitaxial growth processes can include, but are not limited to, molecular beam epitaxy (MBE) and low-energy plasma deposition (LEPD). The temperature for an epitaxial deposition process typically ranges from about 300° C. to about 900° C. Although higher temperature will typically result in faster deposition of the semiconductor material, the faster deposition may also result in crystal defects and film cracking.

In at least one embodiment thereof this invention can employ semiconductor on insulator (SOI) technology where a thin semiconductor layer, such as a layer of SiGe or a layer of Si, is formed over an insulating layer, such as silicon oxide, which in turn is formed over a (bulk) substrate, such as a Si substrate. The insulating layer can be referred to as a buried oxide (BOX) layer or simply as a BOX. For a single BOX SOI wafer the SOI layer can be divided into active regions by shallow trench isolation (STI) which intersects the BOX and provides total isolation for active device regions formed in the SOI layer. For FinFET devices the fin structures can be defined in the SOI layer and sources and drains can be formed, for example, by the epitaxial growth of in situ doped raised S/Ds. The in situ doped S/Ds can be doped during the epitaxial growth process to be n-type with, for example, Phosphorous or the in situ doped S/Ds can be doped p-type with, for example, Boron. A FET channel region between a S/D pair underlies a gate structure.

Unless expressly indicated differently any references to a "top surface" herein imply a surface in a direction away from some surface that would support a wafer substrate, while any references to a "bottom surface" imply a surface in a direction towards the surface that would support the wafer substrate.

Figure 1:
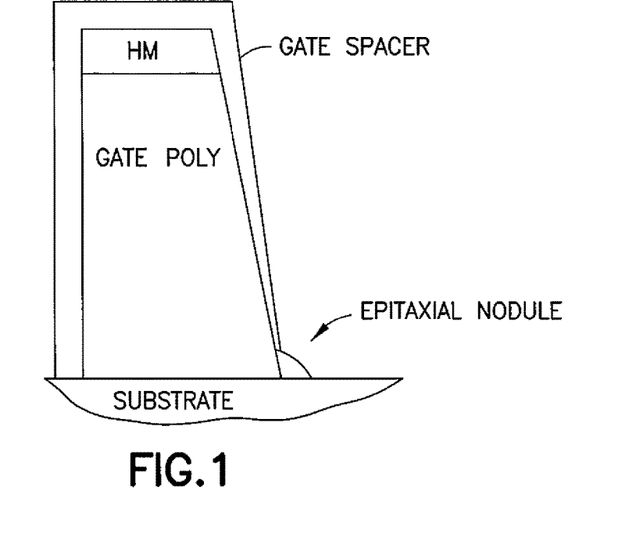
FIG. 1 is an enlarged cross-sectional view of a portion of a gate poly region having an overlying gate dielectric spacer, and also shows a presence of an undesired epitaxial nodule formed adjacent to a tapered sidewall of the gate poly.

Referring to FIG. 1, one issue that can arise during conventional FinFET fabrication flow that employs a replacement metal gate (RMG) process is, after polysilicon (poly) gate patterning (i.e., after dummy or sacrificial or placeholder or precursor gate patterning) in conjunction with an overlying hard mask (HM), at least the ends of the gate poly precursor structures, where they turn and are joined together in what may be referred to as an isolation (iso) region, can have tapered sidewalls as opposed to substantially vertical sidewalls that would be present in a denser region of the substrate where there are more gate poly precursor structures present. After gate dielectric (e.g., nitride) spacer deposition and a spacer etch step to expose the fins, due to the presence of the tapered sidewall of the gate poly there can be incomplete and/or thinned spacer material coverage at least towards the bottom portion of the tapered sidewalls of the gate poly. That is, due to the tapered sidewall the spacer etch may remove more spacer material than is desired at the bottom portion of the tapered sidewall. During subsequent epitaxial growth of the S/D semiconductor material to form the RSDs the incomplete spacer coverage of the poly gate can result in the formation of undesired epitaxy (epi) nodules at the gate ends where epitaxial deposition of the S/D material also occurs on the exposed poly. The presence of the electrically conductive epi nodules can, in turn, result in undesired electrical shorts. When the gate poly structures are subsequently "cut" and removed where they turn typically by some poly-specific etching process, as well as at intermediate portions of the gate poly structures to define gates for different devices (e.g., see the gate isolation 32A in FIG. 9), the semiconductor epi nodules will not be removed.

The embodiments of this invention provide in one non-limiting aspect thereof a method to fabricate a FinFET that avoids the electrically conductive epi nodule issue by forming precursor poly gates and gate spacers followed by S/D epitaxy, where epi nodules occur at tapered poly gate loops; applying a gate cut mask to expose at least the poly gate ends and loops, but not actually cutting and removing the poly gate ends and loops; and then oxidizing the exposed poly gate ends and poly gate loops to convert the poly into an oxide (into an electrical insulator). During this oxidation process the epi nodules are also oxidized and converted to the electrical insulator (e.g., into $SiO_2$) thereby removing the possibility in a completed device of the epi nodule(s) causing an electrical short circuit.

Figure 2:
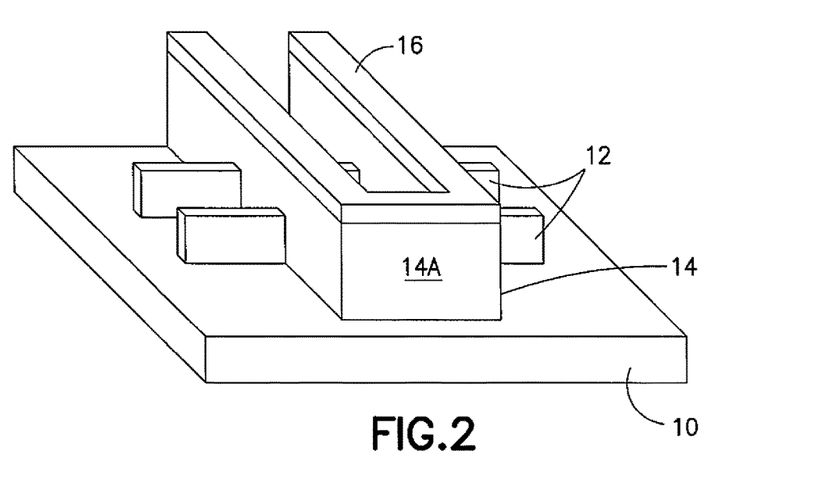
FIG. 2 shows a starting structure including a substrate, fins, gate poly (gate precursor) and a hard mask.

FIG. 2 shows an enlarged elevational view of a starting substrate 10. The top surface of the substrate 10 can be a surface of an SOI layer in an SOI embodiment. Disposed on the top surface of the substrate 10 is some number of spaced apart fins 12 that are arranged parallel to one another. The fins 12 can be composed of, for example, Si or SiGe (or a Group III-V material such as GaAs, InGaAs, AlGaAs, etc.) and can be formed by masking and selectively removing a part of a bulk semiconductor substrate or an SOI layer. After a masking operation and a sidewall image transfer (SIT)

process gate poly 14 is selectively deposited over and orthogonal to the fins 12. The gate poly 14 is a gate precursor, i.e., a sacrificial material that will be subsequently removed during a replacement metal gate (RMG) process. Disposed on a top surface of the gate poly 14 is a hard mask (HM) layer 16, such as a layer of nitride (e.g., $Si_3N_4$). The culmination of this process results in the presence of gate loops 14A (one of which is shown in FIG. 2) existing at the ends of the gate poly 14 and connecting two adjacent gate poly structures. As was shown in FIG. 1, the sidewalls of the gate end loops 14A tend to be tapered (not vertical) due at least to a patterning process that uses, for example, a reactive ion etch (RIE) in the isolation (iso) region. In typical embodiments the portion of the substrate 10 upon which the fins 12 and gate poly 14 are disposed is comprised of an oxide such as a shallow trench isolation (STI) oxide.

As non-limiting examples, the height of the fins 12, relative to the top surface of the substrate 10, can be in a range of about 30 nm to about 50 nm, with 40 nm being one suitable nominal value; the width of the fins 12 can be in a range of about 8 nm to about 15 nm, with 12 nm being one suitable nominal value; the width of the gate poly 14 can be in a range of about 20 nm to about 40 nm, with 30 nm being one suitable nominal value; and the HM 16 can have a thickness in a range of about 20 nm to about 50 nm. As was noted above, shallow trench isolation (STI) oxide can be present beneath the gate poly 14 and between the fins 12.

Figure 3:
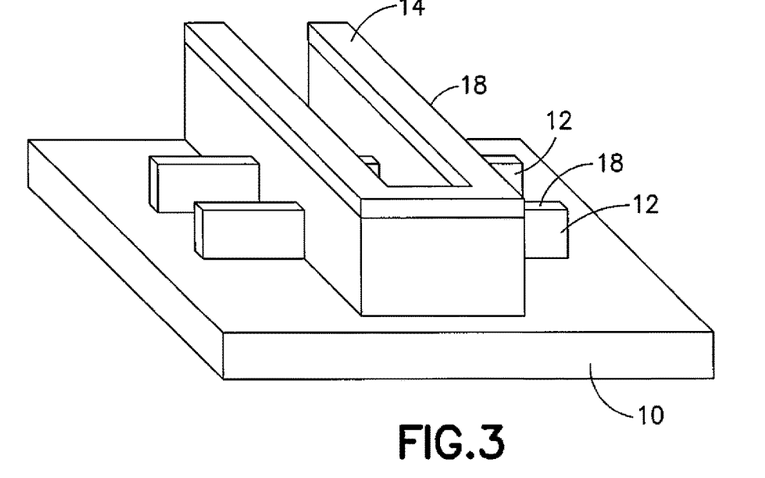
FIG. 3 shows the structure of FIG. 2 after the blanket deposition of a gate spacer.

FIG. 3 shows the structure of FIG. 2 after blanket depositing a gate spacer 18 to cover the fins 12, the gate poly 14 and the layer of HM 16. The gate spacer 18 can be composed of any suitable low dielectric constant (low-k) spacer material such as a nitride (e.g., $Si_3N_4$, k=7.5) or SiBCN (k=5.2), and can have an exemplary thickness in a range of about 5 nm to about 10 nm.

Figure 4:
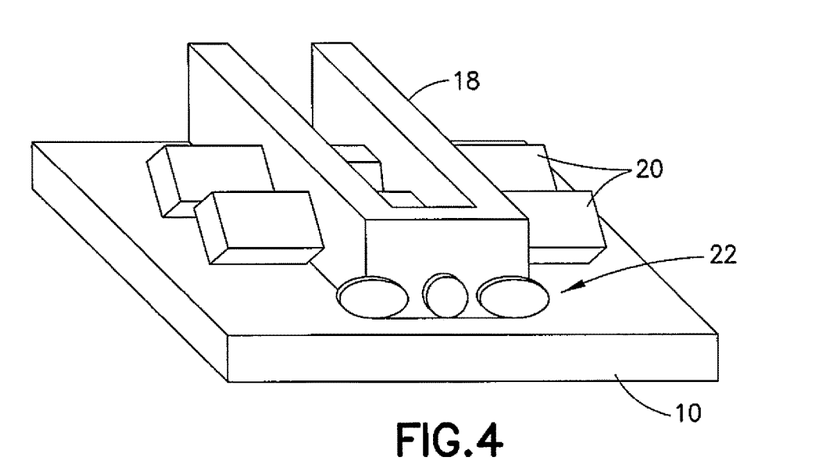
FIG. 4 shows the structure of FIG. 3 after removing the deposited spacer material from the fins and performing S/D epitaxy to fabricate in situ doped S/Ds, with undesirable epi nodules also being formed in regions where there is incomplete gate spacer coverage on the poly sidewalls.

FIG. 4 shows the structure of FIG. 3 after removing the nitride spacer 18 from the fins 12 and then performing S/D epitaxy on the exposed fins to fabricate in situ doped (e.g., Boron doped Si) RSDs 20. Due to the sidewall taper of the gate end region (loop) 14A, after the spacer etch there can be incomplete (broken) coverage of the gate poly 14 by the gate spacer 18, as was shown in FIG. 1, resulting in the possibility that some of the underlying gate poly 14 is exposed. Also as was shown in FIG. 1, during the RSD epitaxy process epi nodules 22 can be formed where there existed in the gate end region (loop) 14A incomplete (broken) coverage of the gate poly 14 by the gate spacer 18. The epi nodules 22 may tend to form at the bottom of the gate end region (loop) 14A sidewall, adjacent to the surface of the substrate 10, due to the presence of the taper and the increased potential, after the spacer etch, for the incomplete (broken) coverage of the gate poly 14 by the gate spacer 18.

Figure 5:
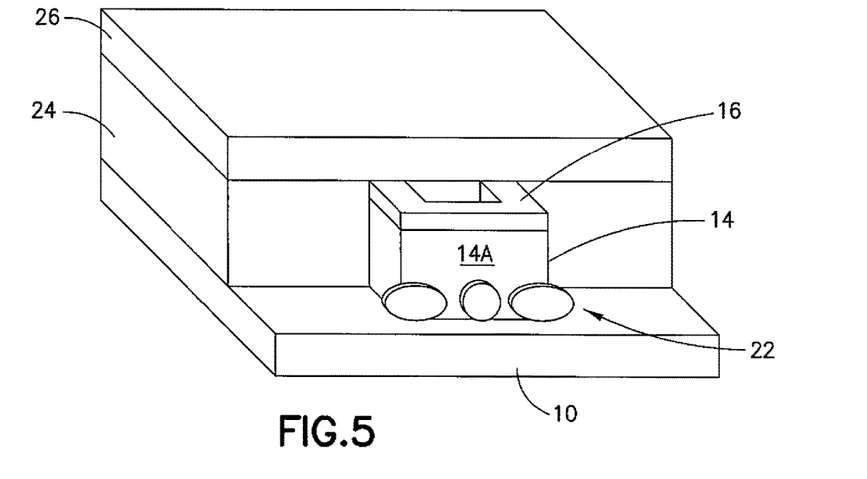
FIG. 5 shows the structure of FIG. 4 after depositing an inter-layer dielectric (ILD), application of a mask that would in a conventional process flow be referred to as a gate cut mask, and removal of the gate spacer to expose the gate end poly and the connecting gate loop poly, as well as the epi nodules.

FIG. 5 shows the structure of FIG. 4 after depositing an inter-layer dielectric (ILD) layer 24, e.g., a layer of $SiO_2$, to about the top surface of the HM 16. What would normally be a gate cut mask 26 (e.g., a layer of photoresist) is then deposited and patterned to form mask openings, and the underlying ILD 24 is recessed (removed) in the mask openings so as to expose the gate spacer-covered ends of the poly gates 14 and the connecting gate loops 14A, as well as the surface of the substrate 10 and the epi nodules 22. Any intermediate portions of the poly long gate structures that are desired to be electrically separated (e.g., see the gate isolation 32A in FIG. 9) are also exposed. The gate spacer 18 is then removed by a suitable wet or dry etching process to expose the ends of the poly gates 14, the connecting poly gate loops 14A, any intermediate portions of the poly long gate structures and the overlying HM 16.

Figure 6:
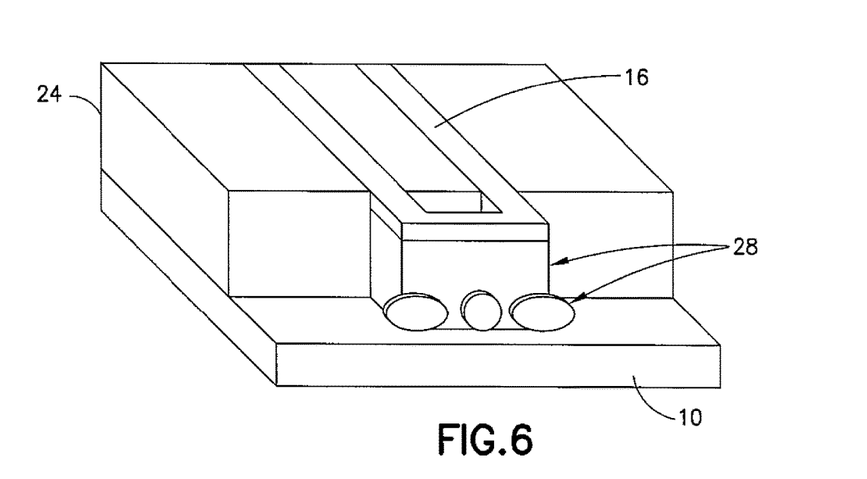
FIG. 6 shows the structure of FIG. 5 after oxidizing the exposed gate poly and gate loop poly and the epi nodules to form a non-electrically conductive dielectric material (an oxide)

FIG. 6 shows the structure of FIG. 5 after oxidizing the exposed ends of the poly gates 14, the poly gate loops 14A and the epi nodules 22. That is, what would normally be considered to be a gate cut mask 26, used to etch away (cut and remove) the poly gate ends and connecting loops, and the poly in the gate isolation regions 32A (see FIG. 9), is instead used, and could be referred to as, an oxidation mask that is used to convert the exposed ends and intermediate portions of the poly gates 14, the connecting poly gate loops 14A and the epi nodules 22 to a non-conductive dielectric oxide material 28. Oxidation of the exposed portions of the polysilicon gates 14 and the gate loops 14A (~20 nm length gate) can be accomplished, if the fins 12 and RSDs 20 contain SiGe, by the use of a low temperature wet oxidation process (e.g., 400° C.–600° C. in a water vapor atmosphere to prevent oxidation of the SiGe). If the fins 12 and RSDs 20 contain only Si then a higher temperature (e.g., typically about 1000° C.) dry oxidation process can be used. During the oxidation process the sacrificial poly gate precursor structures 14 are protected at least by the overlying mask 26, the gate spacers 18 on the gate sidewalls and the nitride HM cap 16 on the top of the gates. During the oxidation process, and due to the small critical dimension of the gate poly 14 (e.g., about 20 nm), all of the exposed gate poly is typically converted to oxide.

Figure 7:
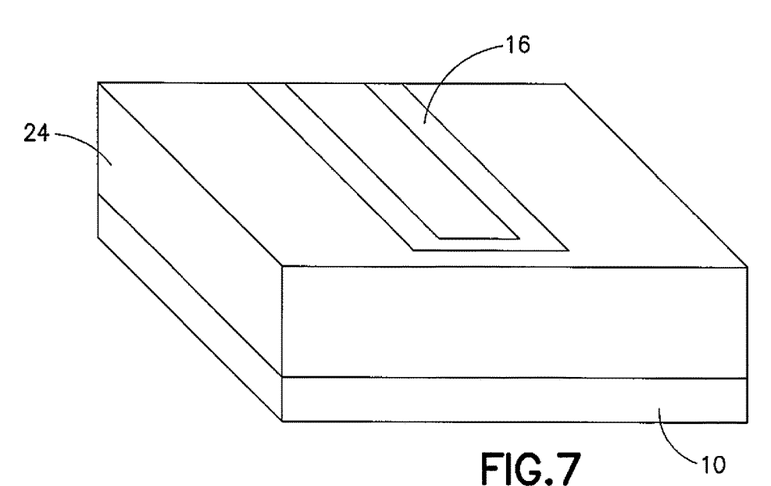
FIG. 7 shows the structure of FIG. 6 after performing an oxide fill/polish process to cover and bury the non-conductive dielectric material.

FIG. 7 shows the structure of FIG. 6 after removing the mask 26 and performing an oxide fill/polish process to cover and bury the non-conductive dielectric material 28.

Figure 8:
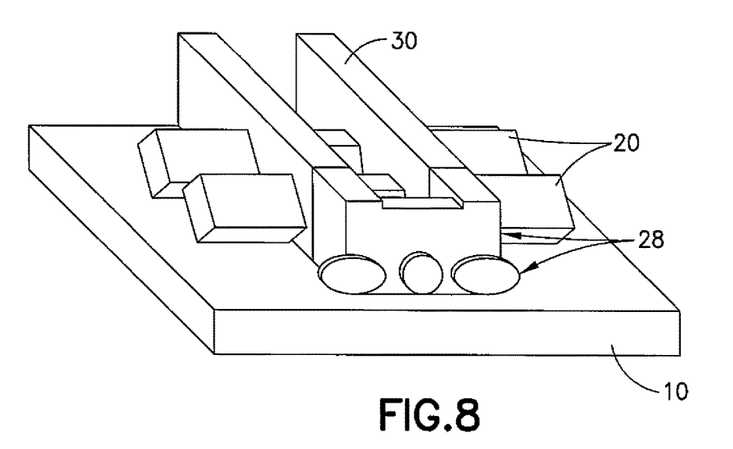
FIG. 8 shows the structure of FIG. 7 after performing a replacement metal gate (RMG) procedure.

FIG. 8 shows the structure of FIG. 7 after performing a replacement metal gate (RMG) procedure to remove the HM cap 16 and to replace (between the retained gate spacer 18 material) the gate poly (sacrificial or placeholder or precursor gate 14) with a desired metal gate material. The gate placeholder (the sacrificial gate precursor structures 14) can removed by a dry etch or wet etch process. In an embodiment where the gate precursor is comprised of polycrystalline silicon it can be removed, for example, with a dry etch process comprising $SF_6$ or with a wet etch process comprising aqueous $NH_4OH$ or tetramethylammonium hydroxide, as non-limiting examples. The gate metal can be deposited directly on a top surface of a gate dielectric such as a high-k dielectric layer (dielectric constant greater than $SiO_2$, not shown), such as a layer of $HfO_2$ or $ZrO_2$ by, for example, CVD, physical vapor deposition (PVD), or atomic layer deposition (ALD). As non-limiting examples the gate metal can include a metal system selected from one or more of TiN, TiC, TiAlC, TaN, TaC, TaAlC, TaSiN, HfN, W, Al and Ru, and may be selected at least in part based on the desired work function (WF) of the completed device (nFET or pFET), as is known.

A flowable CVD (FCVD) process may be used to provide a dielectric cover. Processing can then continue in a conventional manner, for example, to form one or more dielectric layers (e.g., an inter-layer dielectric (ILD) if not already present and back end of line (BEOL) dielectric layers), to form gate contacts and S/D contacts, and to form vertical and horizontal conductive interconnects as is known in the art in order to connect the FinFET and other FinFETs into a desired circuit configuration.

Figure 9:
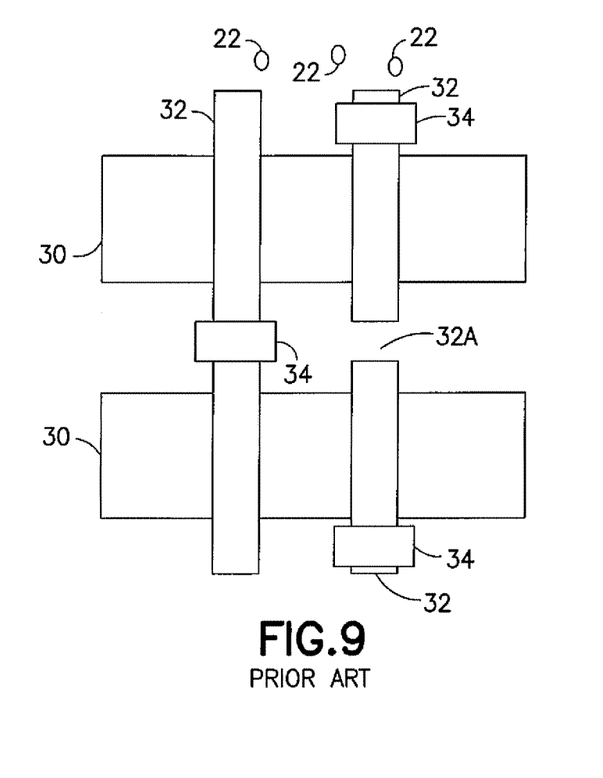
FIG. 9 is an enlarged top view of a conventional fin active region with overlying cut gates and associated gate contacts.

FIG. 9 is an enlarged top view showing conventional active fin regions 30 with overlying cut gates 32 and associated gate contacts 34. A gate isolation region 32A is shown dividing one of the long gate structures into gate sub-structures. As was explained above, the undesirable conductive semiconductor epi nodules 22 can still exist where the gates were cut (where they were etched in the gate cut region).

Figure 10:
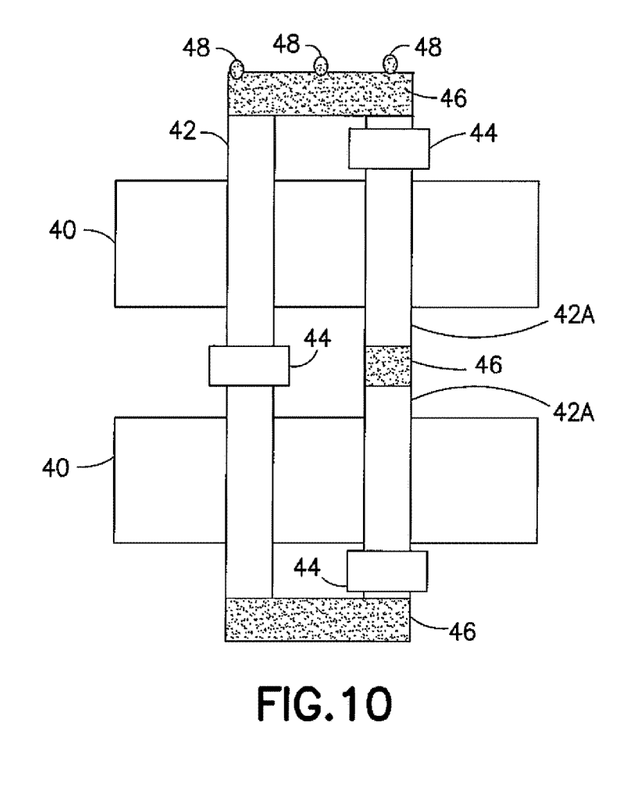
FIG. 10 is an enlarged top view, in accordance with embodiments of this invention, of fin active regions with overlying gates and associated gate contacts, where gate oxidation regions exist where conventionally the gate ends, gate loops and intermediate portions of the gate structures would be cut and removed.

FIG. 10 is a simplified enlarged top view, in accordance with embodiments of this invention, of active fin regions 40 with overlying (non-physically cut) metal gates 42 and associated gate contacts 44, where gate oxidation regions 46 exist where conventionally the gates would be cut and removed as was depicted in FIG. 9. Any undesirable epi nodules that are present are oxidized as well (shown as the oxidized nodules 48) and thus rendered electrically non-conductive.

In FIG. 10 it can be appreciated that the semiconductor oxide present in the gate oxidation regions 46 is used to differentiate a particular one of the metal gate structures 42 into two or more contiguous metal gate sub-structures 42A that are separated one from another by the intervening gate oxidation region 46 comprised of the semiconductor oxide (dielectric). In this embodiment the semiconductor oxide is an oxide of the same semiconductor material that was used to define the sacrificial precursor gate structures 14, which was polysilicon in the non-limiting embodiments disclosed above.

In FIG. 10 it can thus be further appreciated that the gate loop portion can have associated therewith at least one of the oxidized semiconductor nodules 48 that is comprised of an oxide of the same semiconductor material that comprises the plurality of raised source/drain structures, and further that the semiconductor oxide that comprises the loop portion is an oxide of a semiconductor material that was used to define the sacrificial precursor gate structures 14 that were replaced by the metal gate structures 42. In FIG. 10 it can be seen that at least one metal gate structure 42 is differentiated into two or more contiguous metal gate sub-structures 42A that are separated one from another by an intervening region 46 comprised of the semiconductor oxide of the semiconductor material that was used to define the sacrificial precursor gate structures 14.

It is to be understood that the exemplary embodiments discussed above with reference to FIGS. 2-8 and 10 can be used on common variants of the FET device including, e.g., FET devices with multi-fingered FIN and/or gate structures and FET devices of varying gate width and length. Moreover, transistor devices can be connected to metalized pads or other devices by conventional metalization and lithographic techniques.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching processes may be used by those skilled in the art. Further, the exemplary embodiments are not intended to be limited to only those semiconductor materials, metals, insulators, dopants, layer thicknesses and the like that were specifically disclosed above. Further still, at least some aspects of this invention pertain as well to planar transistors including planar FinFETs. Any and all such and similar modifications of the teachings of this invention will still fall within the scope of this invention.

What is claimed is:

1. A method, comprising:
   epitaxially depositing source/drains on parallel semiconductor fins having parallel polysilicon gate precursor structures disposed thereon orthogonally to the fins, where two adjacent polysilicon gate precursor structures are joined together and connected at ends thereof by a polysilicon loop portion; and
   oxidizing the ends of the polysilicon precursor gate structures and at least a portion of an outer surface of the connecting polysilicon loop portion.

2. The method as in claim 1, where the step of epitaxially depositing the source/drains epitaxially deposits in situ doped source/drains.

3. The method as in claim 1, where the step of oxidizing comprises a step of forming thermal oxide using a wet oxidation process.

4. The method as in claim 1, where the step of oxidizing comprises a step of forming thermal oxide using a dry oxidation process.

5. The method as in claim 1, where the step of epitaxially depositing the source/drains comprises an initial step of depositing a gate spacer dielectric layer on sidewalls of at least the polysilicon precursor gate structures and the connecting polysilicon loop portion.

6. The method as in claim 1, where the step of oxidizing comprises an initial step of applying a mask to cover the source/drains on the semiconductor fins and the polysilicon precursor gate structures, the mask having an opening that exposes the ends of the polysilicon precursor gate structures and the connecting polysilicon loop portion.

7. The method as in claim 6, where the mask further has at least one opening to expose an intermediate portion of the polysilicon precursor gate structure, and where during the step of oxidizing the exposed intermediate portion of the polysilicon precursor gate structure is also oxidized so as to electrically separate the polysilicon precursor gate structure into two electrically isolated polysilicon precursor gate structures.

8. A method, comprising:
providing a structure comprised of a substrate supporting a plurality of semiconductor fins disposed parallel to one another and a plurality of polysilicon gate precursor structures overlying the plurality of fins and disposed parallel to one another and orthogonal to the plurality of fins, where two adjacent gate precursor structures are joined together and connected at ends thereof by a polysilicon loop portion;
depositing a gate spacer dielectric layer on sidewalls of at least the polysilicon gate precursor structures and polysilicon loop portion;
epitaxially depositing semiconductor sources and drains on exposed portions of the fins not underlying the polysilicon gate precursor structures, where epitaxially depositing the semiconductor sources and drains results in semiconductor nodules being formed in a region of the polysilicon loop portion that is not completely covered by the gate spacer dielectric layer;
applying a mask to cover the semiconductor sources and drains and the gate spacer dielectric layer disposed on the sidewalls of at least the polysilicon gate precursor structures, the mask comprising an opening that exposes at least the ends of the polysilicon gate precursor structures and at least a portion of an outer surface of the connecting polysilicon loop portion;
removing the gate spacer dielectric layer from exposed sidewalls of the ends of the polysilicon gate precursor structures and the exposed connecting polysilicon loop portion; and
oxidizing the exposed ends of the polysilicon gate precursor structures and the exposed connecting polysilicon loop portion.

9. The method of claim 8, where the step of removing the gate spacer dielectric layer comprises an initial step of removing inter-layer dielectric material that is exposed through the mask opening.

10. The method as in claim 8, where the step of epitaxially depositing the semiconductor sources and drains epitaxially deposits in situ doped source/drains.

11. The method as in claim 8, where the step of oxidizing comprises a step of forming thermal oxide using a wet oxidation process or a step of forming thermal oxide using a dry oxidation process.

12. The method as in claim 8, where the mask further has at least one opening to expose an intermediate portion of the polysilicon precursor gate structure, and where during the step of oxidizing the exposed intermediate portion of the polysilicon precursor gate structure is also oxidized so as to electrically separate the polysilicon precursor gate structure into two electrically isolated polysilicon precursor gate structures.

13. A structure, comprising:
a substrate;
a plurality of semiconductor fins disposed on a surface of the substrate in a parallel relationship to one another;
a plurality of metal gate structures overlying the plurality of fins and disposed in a parallel relationship to one another and orthogonal to the plurality of fins; and
a plurality of source/drain structures disposed on the fins;
where two adjacent metal gate structures are joined together and connected at end portions thereof by a loop portion, where the loop portion is comprised of a semiconductor oxide.

14. The structure as in claim 13, where the loop portion has associated therewith at least one oxidized semiconductor nodule.

15. The structure as in claim 14, where the oxidized semiconductor nodule is comprised of an oxide of a same semiconductor material that comprises the plurality of source/drain structures.

16. The structure as in claim 13, where the semiconductor oxide is comprised of $SiO_2$.

17. The structure as in claim 13, where a metal gate structure is differentiated into two contiguous metal gate structures that are separated by a portion comprised of the semiconductor oxide.

18. The structure as in claim 13, where the semiconductor oxide is an oxide of a semiconductor material that was used to define sacrificial precursor gate structures that were replaced by metal gate structures, where at least one metal gate structure is differentiated into two or more contiguous metal gate sub-structures that are separated one from another by an intervening region comprised of the semiconductor oxide.

19. The structure as in claim 13, where the loop portion has associated therewith at least one oxidized semiconductor nodule comprised of an oxide of a same semiconductor material that comprises the plurality of source/drain structures, and where the semiconductor oxide that comprises the loop portion is an oxide of a semiconductor material that was used to define sacrificial precursor gate structures that were replaced by the metal gate structures, and where at least one metal gate structure is differentiated into two or more contiguous metal gate sub-structures that are separated one from another by an intervening region comprised of the semiconductor oxide of the semiconductor material that was used to define the sacrificial precursor gate structures.

* * * * *